(12) United States Patent
Yan

(10) Patent No.: US 9,263,387 B2
(45) Date of Patent: Feb. 16, 2016

(54) GOA CIRCUIT OF ARRAY SUBSTRATE AND DISPLAY APPARATUS

(71) Applicants: BOE Technology Group Co., Ltd., Beijing (CN); Beijing BOE Display Technology Co., Ltd., Beijing (CN)

(72) Inventor: Yan Yan, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 16 days.

(21) Appl. No.: 14/499,854

(22) Filed: Sep. 29, 2014

(65) Prior Publication Data

US 2015/0380349 A1   Dec. 31, 2015

(30) Foreign Application Priority Data

Jun. 26, 2014   (CN) .......................... 2014 1 0295588

(51) Int. Cl.
*G09G 5/00* (2006.01)
*H01L 23/528* (2006.01)
*G09G 3/36* (2006.01)
*H01L 23/522* (2006.01)
*H01L 49/02* (2006.01)
*H01L 27/02* (2006.01)
*H01L 27/12* (2006.01)

(52) U.S. Cl.
CPC .............. *H01L 23/528* (2013.01); *G09G 3/36* (2013.01); *H01L 23/5226* (2013.01); *H01L 27/0207* (2013.01); *H01L 27/124* (2013.01); *H01L 27/1255* (2013.01); *H01L 28/40* (2013.01)

(58) Field of Classification Search
CPC ............... G09G 3/3688; G09G 2310/0264; G09G 2310/0272; H01L 23/5226; H01L 27/124
See application file for complete search history.

(56) References Cited

U.S. PATENT DOCUMENTS

| 5,774,100 | A | * | 6/1998 | Aoki | G09G 3/006 345/87 |
|---|---|---|---|---|---|
| 2006/0056267 | A1 | * | 3/2006 | Kim | G09G 3/3677 365/230.06 |
| 2006/0098525 | A1 | * | 5/2006 | Kim | G09G 3/006 365/244 |
| 2007/0296662 | A1 | * | 12/2007 | Lee | G09G 3/3677 345/87 |
| 2010/0289992 | A1 | * | 11/2010 | Nojiri | G02F 1/133512 349/106 |
| 2011/0157263 | A1 | * | 6/2011 | Kim | G09G 3/3677 345/698 |
| 2012/0327057 | A1 | * | 12/2012 | Sakamoto | G11C 19/28 345/211 |
| 2013/0100006 | A1 | * | 4/2013 | Lin | G09G 3/3659 345/94 |
| 2014/0353844 | A1 | * | 12/2014 | Ma | H01L 27/124 257/774 |
| 2015/0162347 | A1 | * | 6/2015 | Yu | H01L 21/768 257/71 |

* cited by examiner

*Primary Examiner* — Joe H Cheng
(74) *Attorney, Agent, or Firm* — Westman, Champlin & Koehler, P.A.

(57) ABSTRACT

The embodiments of the present disclosure provide a GOA circuit of an array substrate and a display apparatus, which are used in the field of display technology, and enable reducing short-cut of a GOA unit due to ESD, and improving the yield of the GOA circuit. The GOA circuit includes a GOA unit and an STV signal wire electrically connected to the GOA unit, the STV signal wire including a first part and a second part; the GOA circuit further includes a first transparent electrode and an insulating layer located between the first transparent electrode and the first part, the first transparent electrode, the first part and the insulating layer forming a first capacitor.

12 Claims, 4 Drawing Sheets

GOA CIRCUIT OF ARRAY SUBSTRATE AND DISPLAY APPARATUS

CROSS-REFERENCE TO RELATED APPLICATION

This Application is a non-provisional Application of Chinese Application No. CN 201410295588.8, filed Jun. 26, 2014, in Chinese, the contents of which are hereby incorporated by reference in their entirety.

TECHNICAL FIELD

The disclosure relates to a display technology, and more particular, to a Gate driver On Array (GOA) circuit of an array substrate and a display apparatus.

BACKGROUND

Liquid crystal displays are flat panel displays used commonly at present. A Thin Film Transistor Liquid Crystal Display (TFT-LCD) is a popular product in the current liquid crystal displays. The GOA technology consists in integrating a gate driver of the TFT-LCD onto an array substrate to scan and drive a panel. Compared to a conventional Chip On Flex/Film (COF) and Chip On Glass (COG) processes, the GOA technology is characterized in that a function of a shifting register is achieved by continuously triggering the GOA driver unit integrated on the array substrate, which realizes a replacement of a bonding region and a Fan-out wiring space of an original gate driver IC. Therefore, two sides of the panel may be symmetry, thereby achieving a design of a narrow frame, reducing a cost and facilitating improvement of productivity.

Currently, the GOA technology has been widely applied in the manufacturing field of the TFT-LCD. However, due to complexity of connection and processes thereof for the circuit, the yield of the GOA circuit is low. A main factor which influences the yield of the GOA circuit is electro-static accumulation and Electra-Static discharge (ESD). In the process of manufacturing the conventional GOA circuit, as a Vertical StarT pulse (hereinafter referred to as "STV") signal wire is long, a significant amount of charges are easily accumulated in an plasma vapor deposition environment. When these charges are discharged to an interior of the GOA unit, it is possible that a phenomenon of electrostatic breakdown of the GOA unit occurs. This results in short-cut of the GOA unit, and thereby the GOA circuit cannot operate in normal. Consequently, the display apparatus cannot display images normally.

SUMMARY

Embodiments of the present disclosure provide a GOA circuit of an array substrate and a display apparatus, enabling reducing short-cut of the GOA unit due to ESD, and improving the yield of the GOA circuit.

In an aspect, the embodiments of the present disclosure provide a GOA circuit of an array substrate, including:
 a GOA unit;
 an STV signal wire electrically connected to the GOA unit, the STV signal wire comprising a first part and a second part;
 a first transparent electrode; and
 an insulating layer between the first transparent electrode and the first part, the first transparent electrode, the first part and the insulating layer forming a first capacitor.

Alternatively, the first transparent electrode is electrically connected to a common electrode wire of the array substrate through at least one via hole.

Alternatively, a width of the first part is larger than or equal to that of the second part.

Alternatively, the second part of the STA signal wire comprises a first subpart and a second subpart, the first subpart being connected to the first capacitor, and the second subpart being connected to the GOA unit; and
 the GOA circuit further comprises a conversion module comprising a first set of via holes, a second set of via holes and a first transparent conductive film, wherein the first set of via holes is configured to connect the first subpart to the first transparent conductive film, the second set of via holes is configured to connect the first transparent conductive film to the second subpart, and the first transparent conductive film is arranged in the same layer as pixel electrodes of the array substrate.

Alternatively, the second part of the STA signal wire comprises a first subpart and a second subpart, the first subpart being connected to the first capacitor, and the second subpart being connected to the GOA unit; and
 the GOA circuit further comprises a conversion module comprising a third set of via holes, a fourth set of via holes, a fifth set of via holes, a sixth set of via holes, a first metal layer, a second transparent conductive film and a third transparent conductive film, wherein the first metal layer is arranged in the same layer as source and drain layers of the array substrate, the second transparent conductive film and the third transparent conductive film are arranged in the same layer as pixel electrodes of the array substrate, the third set of via holes is configured to connect the first subpart to the second transparent conductive film, the fourth set of via holes is configured to connect the second transparent conductive film to the first metal layer, the fifth set of via holes is configured to connect the first metal layer to the third transparent conductive film, and the sixth set of via holes is configured to connect the third transparent conductive film to the second subpart.

Alternatively, the GOA circuit further comprises a bridging module located between the GOA unit and the STV signal wire, wherein the bridging module is configured to form a bridge with the STV signal wire before the SW signal wire is connected to the GOA unit.

Alternatively, the bridging module is a virtual GOA unit, which has the same structure as the GOA unit.

In another aspect, the embodiments of the present disclosure provide a display apparatus, comprising an array substrate and any GOA circuit as described above.

The embodiments of the present disclosure provide a GOA circuit and a display apparatus. The GOA circuit includes a GOA unit and an STV signal wire electrically connected to the GOA unit. The GOA circuit further includes a first capacitor and/or a conversion module and/or a bridging module. When a significant amount of static electric charges are accumulated in the STA signal wire, which may result in electrostatic breakdown thereby damaging the GOA unit, the static electric charges are slowly discharged through the first capacitor and then may also be discharged through the conversion module. In addition, if there are residual static electric charges, when the static electric charges pass through the bridging module, the circuit of the bridging module will be damaged firstly, without influencing the GOA unit which operates in normal.

BRIEF DESCRIPTION OF THE DRAWINGS

In order to illustrate technical solutions in preferable embodiments of the present disclosure more clearly, accompanying drawings needed to be used in the description of the embodiments will be described below in brief. Throughout all of the drawings, the same or corresponding reference signs are used to designate the same or similar components. Obviously, the accompanying drawings described below are merely some examples of the present disclosure. Those skilled persons in the art can further obtain other drawings according to the accompanying drawing obviously.

REFERENCE SIGNS

Figure 1:
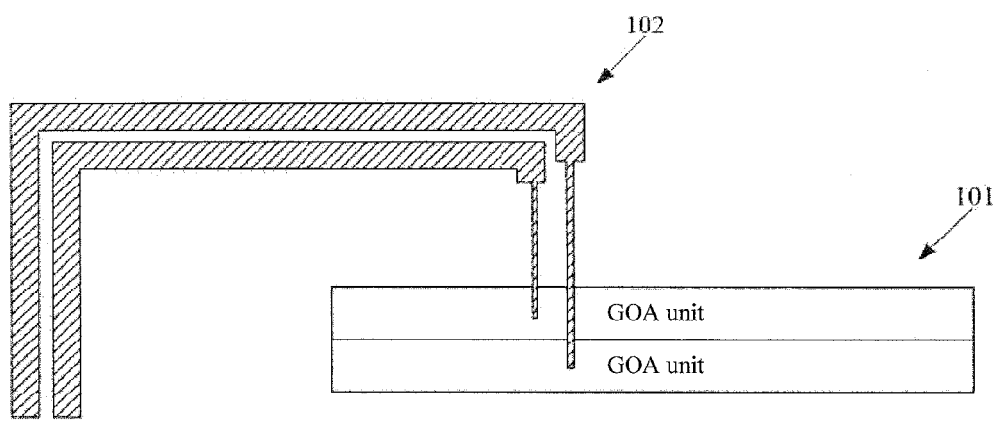
FIG. 1 is a structural schematic diagram of a conventional GOA circuit.

10 GOA circuit
101 GOA unit
102 STV signal wire
1021 First part
1022 Second part
1021a First subpart
1021b Second subpart
103 First capacitor
103a First transparent electrode
104 Conversion module
104a First set of via holes
104b Second set of via holes
104c First transparent conductive film
104d Third set of via holes
104e Fourth set of via holes
104f Fifth set of via holes
104g Sixth set of via holes
104h First metal layer
104i Second transparent conductive film
104j Third transparent conductive film
105 Bridging module

DETAILED DESCRIPTION OF THE EMBODIMENTS

The technical solutions in the embodiments of the present disclosure will be clearly and completely described below with reference to the drawings of the embodiments of the present disclosure. Obviously, the embodiments as described are merely preferable embodiments of the present disclosure. Changes and modifications made by the skilled persons in the art based on the embodiments of the present disclosure should fall to the scope of the present disclosure.

As shown in FIG. 1, a GOA circuit 10 on an array substrate generally includes multiple GOA units 101 and at least one STV signal wire 102 electrically connected to the GOA units 101 to provide a frame start signal to the GOA units 101. The STV signal wire 102 is arranged in the same layer as a gate wire of the array substrate. In practical applications, the start signal may be provided by one STV signal wire 102 to multiple GOA units 101, or may also be provided by two STV signal wires 102 to two adjacent GOA units 101 respectively.

Figure 2:
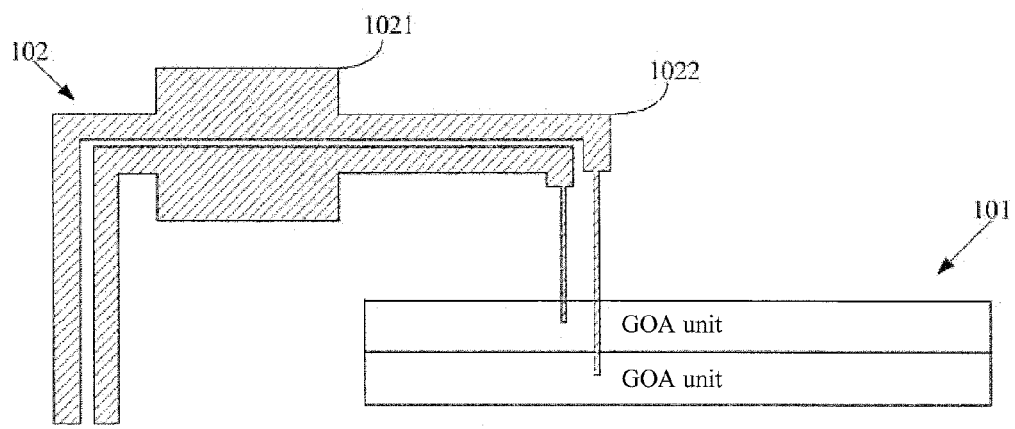
FIG. 2 is a structural schematic diagram of a GOA circuit according to an embodiment of the present disclosure.

In an embodiment of the present disclosure, a GOA circuit 10 of an array substrate is provided. The GOA circuit 101 includes a GOA unit 101 and an STV signal wire 102 electrically connected to the GOA unit 101. Taking two STV signal wires 102 as an example, each STV signal wire 102 includes a first part 1021 and a second part 1022 as shown in FIG. 2.

Figure 3A:
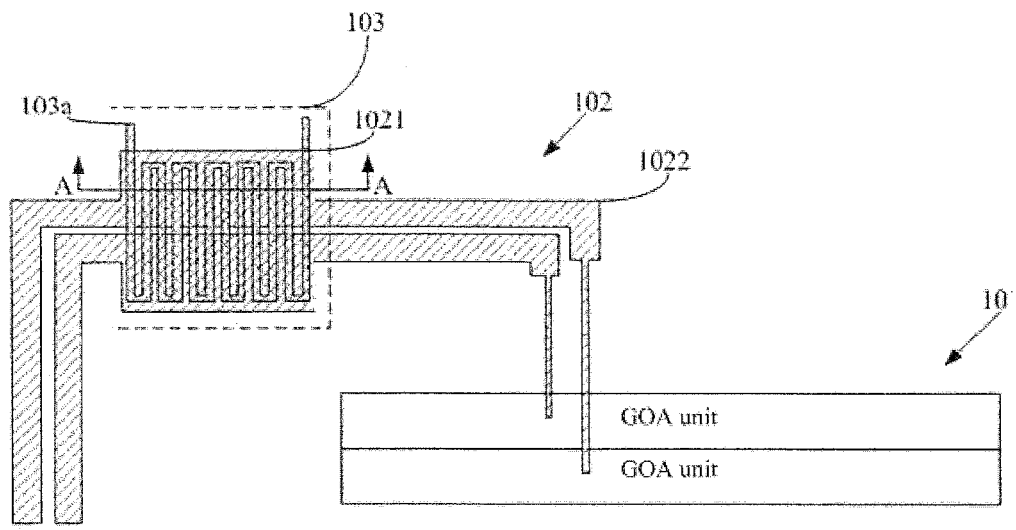
FIG. 3(a) is a structural schematic diagram of a GOA circuit according to another embodiment of the present disclosure.
Figure 3B:
FIG. 3(b) is a sectional view of a first capacitor illustrated in FIG. 3(a)

In another embodiment of the present disclosure, as shown in FIGS. 3(a) and 3(b), the GOA circuit 10 further includes a first transparent electrode 103a and an insulating layer 103b between the first transparent electrode 103a and the first part 1021. The first transparent electrode 103a, the first part 1021 and the insulating layer 103b form a first capacitor 103. FIG. 3(b) is a sectional view along A-A line in FIG. 3(b).

According to the above embodiments, in the process of manufacturing the GOA circuit, when a significant amount of charges are accumulated on the STV signal wire, the charges are not directly discharged to the GOA unit resulting in electrostatic breakdown of the GOA unit, and instead, the charges are slowly discharged through the first capacitor. This can reduce the problem of short-cut of the GOA unit due to the electrostatic breakdown, and improve yield of the GOA circuit, thereby enabling a display apparatus to display the images in normal.

It should be noted that the STV signal wire 102 may be arranged in the same layer and of the same material as the gate wire of the array substrate. In an example, when the gate wire of the array substrate is formed by a patterning process, both the STV signal wire 102 and the gate wire correspond to opaque regions of a mask. After exposure and development, the STV signal wire 102 and the gate wire can be obtained through etching and stripping processes.

In general, as shown in FIG. 3(b), the insulating layer 103b is a passivation layer above the gate wire layer of the array substrate. The first transparent electrode 103a is located above the insulating layer 103b, and is electrically connected to a common electrode wire of the array substrate through at least one via hole. The first transparent electrode 103a is arranged in the same layer and of the same material as the pixel electrodes of the array substrate. Therefore, the first transparent electrode and the pixel electrodes can be obtained through the same one patterning process.

In another embodiment of the present disclosure, a GOA circuit 10 of an array substrate is provided. The GOA circuit 10 includes a GOA unit 101 and an SW signal wire 102 electrically connected to the GOA unit 101. Taking two STV signal wires 102 as an example, each SW signal wire 102 includes a first part 1021 and a second part 1022. The GOA circuit 10 further includes a first transparent electrode 103a and an insulating layer 103b between the first transparent electrode 103a and the first part 1021. The first transparent electrode 103a, the first part 1021 and the insulating layer 103b form a first capacitor 103.

Alternatively, the first transparent electrode 103a is electrically connected to a common electrode wire of the array substrate through at least one via hole, thereby enabling increasing an amount of charges capable of being held in the first capacitor 103.

Preferably, when the first capacitor 103 is formed, a width of the first part 1021 of the STV signal wire 102 is larger than that of the second part 1022.

Figure 4:
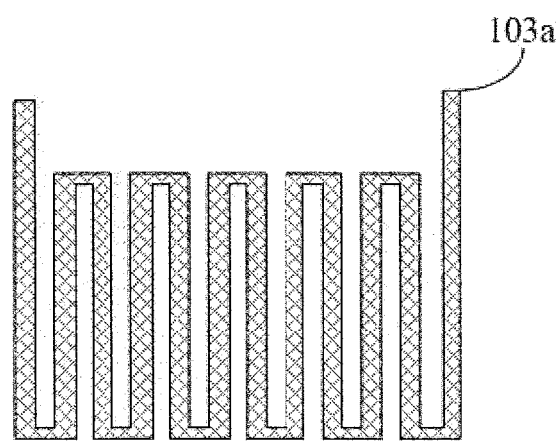
FIG. 4 is a structural schematic diagram of a first transparent electrode illustrated in FIG. 3(a)

Alternatively, the first transparent electrode 103*a* is in an "S" shape or a rectangular shape corresponding to the first part 1021. This can increase an area of the first transparent electrode 103*a* opposite to the first part 1021, thereby enabling increasing the capacitance of the first capacitor and thus more effectively discharging the charges accumulated on the STV signal wire 102. For example, as shown in FIG. 4, the first transparent electrode 103*a* is in an "S" shape.

Figure 5A:
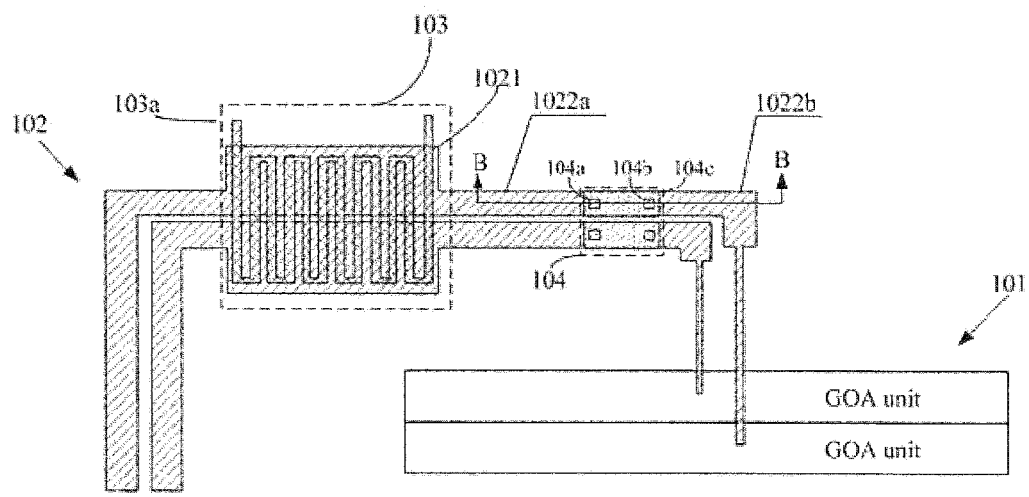
FIG. 5(a) is a structural schematic diagram of a GOA circuit according to another embodiment of the present disclosure.
Figure 5B:
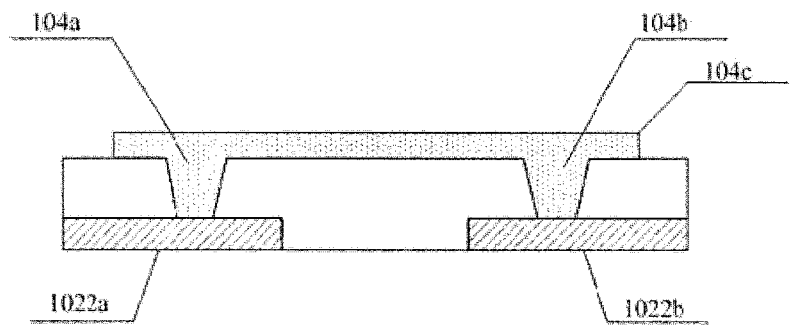
FIG. 5(b) is a sectional view of a conversion module illustrated in FIG. 5(a)

FIG. 5(*a*) is a structural schematic diagram of a GOA circuit according to another embodiment of the present disclosure. As shown in FIG. 5(*a*), the second part 1022 of the STV signal wire 102 includes a first subpart 1022*a* and a second subpart 1022*b*. The first subpart 1022*a* is connected to the first capacitor 103, and the second subpart 1022*b* is connected to the GOA unit. The GOA circuit further includes a conversion module 104, including a first set of via holes 104*a*, a second set of via holes 104*b* and a first transparent conductive film 104*c*. The first set of via holes 104*a* includes at least one via hole, and is configured to connect the first subpart 1022*a* to the first transparent conductive film 104*c*. The second set of via holes 104*b* includes at least one via hole, and is configured to connect the first transparent conductive film 104*c* to the second subpart 1022*b*. The first transparent conductive film 104*c* is arranged in the same layer as the pixel electrodes of the array substrate. FIG. 5(*b*) is a sectional view along a B-B line in FIG. 5(*a*).

It should be noted that an insulating layer is provided between the STV signal wire 102 and the first transparent conductive film 104*c*. The first transparent conductive film 104*c* is arranged in the same layer and of the same material as the pixel electrodes of the array substrate. In an example, when the pixel electrodes of the array substrate are formed with a patterning process, a transparent conductive film is firstly deposited, and then is exposed by using a first mask. Both the first transparent conductive film 104*c* and the pixel electrodes correspond to opaque regions of the first mask. After exposure and development, the first transparent conductive film 104*c* and the pixel electrodes can be obtained through the etching and stripping processes.

Figure 6:
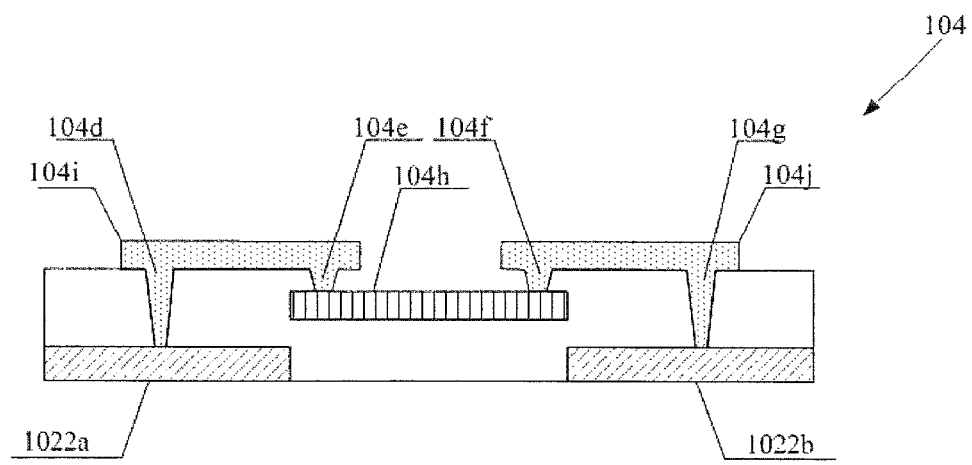
FIG. 6 is a sectional view of a conversion module according to another embodiment of the present disclosure.

Alternatively, as shown in FIG. 6, the second part 1022 of the STV signal wire includes a first subpart 1022*a* and a second subpart 1022*b*. The first subpart 1022*a* is connected to the first capacitor 103, and the second subpart 1022*b* is connected to the GOA unit 101. The conversion module 104 may further include a third set of via holes 104*d*, a fourth set of via holes 104*e*, a fifth set of via holes 104*f*, a sixth set of via holes 104*g*, a first metal layer 104*h*, a second transparent conductive film 104*i* and a third transparent conductive film 104*j*. The first metal layer 104*h* is arranged in the same layer as source and drain layers of the array substrate, the second transparent conductive film 104*i* and the third transparent conductive film 104*j* are arranged in the same layer as pixel electrodes of the array substrate. The third set of via holes 104*d* includes at least one via hole, and is configured to connect the first subpart 1022*a* to the second transparent conductive film 104*i*, the fourth set of via holes 104*e* includes at least one via hole, and is configured to connect the second transparent conductive film 104*i* to the first metal layer 104*h*, the fifth set of via holes 104*f* includes at least one via hole, and is configured to connect the first metal layer 104*h* to the third transparent conductive film 104*i*, and the sixth set of via holes 104*g* includes at least one via hole, and is configured to connect the third transparent conductive film 104*j* to the second subpart 1022*b*.

It should be noted that an insulating layer is provided between the STV signal wire 102 and the first metal layer 104*h*, and there are also insulating layers among the first metal 104*h*, the second transparent conductive film 104*i* and the third transparent conductive film 104*j*. The first metal layer 104*h* is arranged in the same layer and of the same material as source and drain electrodes of the array substrate. In an example, when the source and drain electrodes of the array substrate are formed with a patterning process, a metal film layer is firstly deposited, and then is exposed by using a second mask. Both the first metal layer 104*h* and the source and drain electrodes correspond to the opaque regions of the second mask. After exposure and development, the first metal layer 104*h* and the source and drain electrodes can be obtained through etching and stripping processes. The second transparent conductive film 104*i* and the third transparent conductive film 104*j* are arranged in the same layer and of the same material as pixel electrodes of the array substrate. In an example, when the pixel electrodes of the array substrate are formed with a patterning process, a transparent conductive film is firstly deposited, and then is exposed by using a third mask. Both the second transparent conductive film 104*i*, the third transparent conductive film 104*j* and the pixel electrodes correspond to the opaque regions of the mask. After exposure and development, the first transparent conductive film 104*c* and the pixel electrodes can be obtained with the etching and stripping processes.

Alternatively, the conversion module 104 is provided between the first capacitor 103 and the GOA unit 101. The conversion module 104 may be close to the GOA unit 101.

Figure 7:
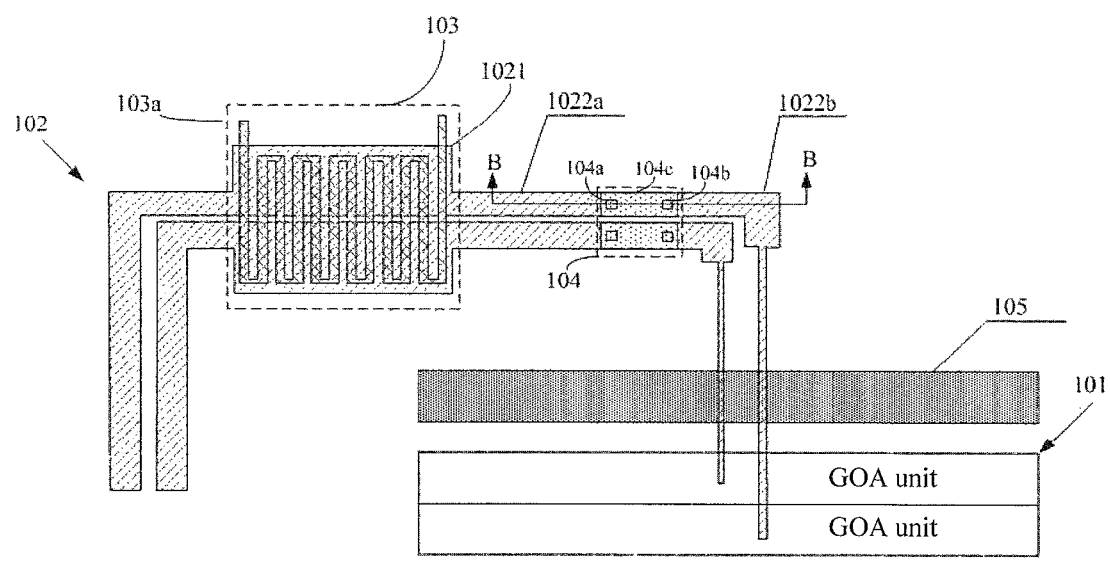
FIG. 7 is a structural schematic diagram of a GOA circuit according to another embodiment of the present disclosure.

Further, as shown in FIG. 7, the GOA circuit 10 may further include a bridging module 105. The bridging module 105 is provided between the GOA unit 101 and the STA signal wire 102, and is configured to form a bridge with the STV signal wire 102 before the STV signal wire 102 is connected to the GOA unit 101.

It should be noted that an insulating layer may be provided between the STA signal wire 102 and the bridging module 105. When the STA signal wire 102 applies a start signal to the GOA unit 101, a bridge is formed with a part of circuits in the GOA unit 101. If there are a significant amount of charges accumulated in the STA signal wire 102, electrostatic breakdown may easily occur in the bridging part. Therefore, one bridging module 105 may be arranged between the GOA unit 101 and the STV signal wire 102, and is configured to form a bridge with the STV signal wire 102 before the STV signal wire 102 is connected to the GOA unit 101. Therefore, if there are a significant amount of charges accumulated in the STV signal wire 102 and there are still a significant amount of residual charges after the charges pass through the first capacitor 103 and/or the conversion module 104, the charges firstly pass through the bridging module 105 and are discharged through electrostatic breakdown of the bridging module. Then the STV signal wire 102 is electrically connected to the GOA unit 101, enabling further protecting the circuit of the GOA unit 101.

Preferably, the bridging module 105 is a virtual GOA unit, which has the same structure as the GOA unit 101. As electrostatic breakdown due to the bridge is unpredictable, the bridging module 105 may be configured as a virtual GOA unit which is totally the same as the GOA unit 101. When there are residual static electric charges in the STV signal wire which may result in electrostatic breakdown, the virtual GOA unit will firstly be damaged, without damaging the GOA unit which operates in normal.

The embodiment of the present disclosure provides a GOA circuit, which includes a GOA unit and an STV signal wire connected to the GOA unit. The GOA circuit further includes at least one of a first capacitor, a conversion module, and a bridging module. When a significant amount of static electric charges are accumulated in the STA signal wire, which may result in electrostatic breakdown thereby damaging the GOA unit, the static electric charges are slowly discharged through the first capacitor and then may also be discharged through the conversion module. In addition, if there are still residual static electric charges, when the static electric charges pass through the bridging module, the circuit of the bridging module will be damaged firstly, without influencing the GOA unit which operates in normal.

The embodiments of the present disclosure provide a display apparatus which includes an array substrate and a GOA circuit 10. The GOA circuit 10 includes a GOA unit 101 and an STV signal wire 102 electrically connected to the GOA unit 101. The GOA circuit 10 further includes a first capacitor 103 and/or a conversion module 104 and/or a bridging module 105.

The STV signal wire 102 includes a first part 1021 and a second part 1022. The first capacitor 103 is comprised of a first transparent electrode 103a, a first part 1021 and an insulating layer 103b. The first transparent electrode 103a is electrically connected to a common electrode wire of the array substrate through at least one via hole.

The second part 1022 of the STA signal wire 102 includes a first subpart 1022a and second subpart 1022b. The GOA circuit 10 further includes a conversion module 104. The conversion module 104 includes a first set of via holes 104a, a second set of via holes 104b and a first transparent conductive film 104c. The first set of via holes 104a is configured to connect the first subpart 1022a to the first transparent conductive film 104c, the second set of via holes 104b is configured to connect the first transparent conductive film 104c to the second subpart 1022b, and the first transparent conductive film 104c is arranged in the same layer as pixel electrodes of the array substrate.

Alternatively, the conversion module 104 may further include a third set of via holes 104d, a fourth set of via holes 104e, a fifth set of via holes 104f, a sixth set of via holes 104g, a first metal layer 104h, a second transparent conductive film 104i and a third transparent conductive film 104j. The first metal layer 104h is arranged in the same layer as source and drain layers of the array substrate, the second transparent conductive film 104i and the third transparent conductive film 104j are arranged in the same layer as pixel electrodes of the array substrate. The third set of via holes 104d is configured to connect the first subpart 1022a to the second transparent conductive film 104i, the fourth set of via holes 104e is configured to connect the second transparent conductive film 104i to the first metal layer 104h, the fifth set of via holes 104f is configured to connect the first metal layer 104h to the third transparent conductive film 104i, and the sixth set of via holes 104g is configured to connect the third transparent conductive film 104j to the second subpart 1022b.

The GOA circuit 10 further includes a bridging module 105. The bridging module 105 is located between the GOA unit 101 and the STA signal wire 102, and is configured to form a bridge with the STV signal wire 102 before the SW signal wire 102 is connected to the GOA unit 101.

The embodiments of the present disclosure provide a display apparatus, which includes an array substrate and a GOA circuit. The GOA circuit includes a GOA unit and an STV signal wire electrically connected to the GOA unit. The GOA circuit further includes a first capacitor and/or a conversion module and/or a bridging module. When a significant amount of static electric charges are accumulated in the STA signal wire, which may result in electrostatic breakdown thereby damaging the GOA unit, the static electric charges are slowly discharged through the first capacitor and then may also be discharged through the conversion module. If there are still residual static electric charges, when the static electric charges pass through the bridging module, the circuit of the bridging module will be damaged firstly, without influencing the GOA unit which operates in normal.

The above description is merely specific embodiments of the present disclosure, and the scope of the present disclosure is not limited thereto. Changes or substitutions, which can be obviously envisaged by those skilled persons in the art, should be included in the scope of the present disclosure without departing the scope defined by the appended claims.

What is claimed is:

1. A Gate driver On Array (GOA) circuit, comprising:
    a GOA unit;
    a Vertical StarT pulse (STV) signal wire electrically connected to the GOA unit, the STV signal wire comprising a first part and a second part;
    a first transparent electrode; and
    an insulating layer arranged between the first transparent electrode and the first part, the first transparent electrode, the first part and the insulating layer forming a first capacitor.

2. The GOA circuit according to claim 1, wherein the first transparent electrode is electrically connected to a common electrode wire of an array substrate through at least one via hole.

3. The GOA circuit according to claim 2, wherein the second part of the STA signal wire comprises a first subpart and a second subpart, the first subpart being connected to the first capacitor, and the second subpart being connected to the GOA unit; and
    the GOA circuit further comprises a conversion module comprising a first set of via holes, a second set of via holes and a first transparent conductive film, wherein the first set of via holes is configured to connect the first subpart to the first transparent conductive film, the second set of via holes is configured to connect the first transparent conductive film to the second subpart, and the first transparent conductive film is arranged in the same layer as pixel electrodes of the array substrate.

4. The GOA circuit according to claim 2, wherein the second part of the STV signal wire comprises a first subpart and a second subpart, the first subpart being connected to the first capacitor, and the second subpart being connected to the GOA unit;
    the GOA circuit further comprises a conversion module comprising a third set of via holes, a fourth set of via holes, a fifth set of via holes, a sixth set of via holes, a first metal layer, a second transparent conductive film and a third transparent conductive film, wherein the first metal layer is arranged in the same layer as source and drain layers of the array substrate, the second transparent conductive film and the third transparent conductive film are arranged in the same layer as pixel electrodes of the array substrate, the third set of via holes is configured to connect the first subpart to the second transparent conductive film, the fourth set of via holes is configured to connect the second transparent conductive film to the first metal layer, the fifth set of via holes is configured to connect the first metal layer to the third transparent conductive film, and the sixth set of via holes is configured to connect the third transparent conductive film to the second subpart.

5. The GOA circuit according to claim 2, further comprising a bridging module located between the GOA unit and the STV signal wire, wherein the bridging module is configured to form a bridge with the STV signal wire before the STV signal wire is connected to the GOA unit.

6. The GOA circuit according to claim 5, wherein the bridging module is a virtual GOA unit, which has the same structure as the GOA unit.

7. The GOA circuit according to claim 1, wherein a width of the first part is larger than or equal to that of the second part.

8. The GOA circuit according to claim 1, wherein the second part of the STA signal wire comprises a first subpart and a second subpart, the first subpart being connected to the first capacitor, and the second subpart being connected to the GOA unit; and the GOA circuit further comprises a conversion module comprising a first set of via holes, a second set of via holes and a first transparent conductive film, wherein the first set of via holes is configured to connect the first subpart to the first transparent conductive film, the second set of via holes is configured to connect the first transparent conductive film to the second subpart, and the first transparent conductive film is arranged in the same layer as pixel electrodes of the array substrate.

9. The GOA circuit according to claim 1, wherein the second part of the STV signal wire comprises a first subpart and a second subpart, the first subpart being connected to the first capacitor, and the second subpart being connected to the GOA unit;

the GOA circuit further comprises a conversion module comprising a third set of via holes, a fourth set of via holes, a fifth set of via holes, a sixth set of via holes, a first metal layer, a second transparent conductive film and a third transparent conductive film, wherein the first metal layer is arranged in the same layer as source and drain layers of the array substrate, the second transparent conductive film and the third transparent conductive film are arranged in the same layer as pixel electrodes of the array substrate, the third set of via holes is configured to connect the first subpart to the second transparent conductive film, the fourth set of via holes is configured to connect the second transparent conductive film to the first metal layer, the fifth set of via holes is configured to connect the first metal layer to the third transparent conductive film, and the sixth set of via holes is configured to connect the third transparent conductive film to the second subpart.

10. The GOA circuit according to claim 1, further comprising a bridging module located between the GOA unit and the STV signal wire, wherein the bridging module is configured to form a bridge with the STV signal wire before the STV signal wire is connected to the GOA unit.

11. The GOA circuit according to claim 10, wherein the bridging module is a virtual GOA unit, which has the same structure as the GOA unit.

12. A display apparatus, comprising an array substrate and the GOA circuit according to claim 1.

* * * * *